US008269249B2

(12) United States Patent
Song

(10) Patent No.: US 8,269,249 B2
(45) Date of Patent: Sep. 18, 2012

(54) LIGHT EMITTING DEVICE PACKAGE

(75) Inventor: Yong Seon Song, Yongin-si (KR)

(73) Assignee: LG Innotek Co., Ltd., Seoul (KR)

( * ) Notice: Subject to any disclaimer, the term of this patent is extended or adjusted under 35 U.S.C. 154(b) by 284 days.

(21) Appl. No.: 12/636,534

(22) Filed: Dec. 11, 2009

(65) Prior Publication Data

US 2010/0207144 A1 Aug. 19, 2010

(30) Foreign Application Priority Data

Feb. 18, 2009 (KR) .................. 10-2009-0013576

(51) Int. Cl.
*H01L 29/22* (2006.01)
*H01L 29/227* (2006.01)
*H01L 33/00* (2010.01)

(52) U.S. Cl. ............ 257/99; 257/98; 257/E33.075
(58) Field of Classification Search ............ 257/98, 257/99, E33.075

See application file for complete search history.

(56) References Cited

U.S. PATENT DOCUMENTS

| 6,531,328 | B1 | 3/2003 | Chen | |
|---|---|---|---|---|
| 7,741,772 | B2 * | 6/2010 | Lin et al. | 313/500 |
| 7,851,817 | B2 * | 12/2010 | Yasuda et al. | 257/98 |
| 2006/0124953 | A1 | 6/2006 | Negley et al. | |
| 2006/0220036 | A1 | 10/2006 | Lee et al. | |
| 2007/0018190 | A1 * | 1/2007 | Kim et al. | 257/99 |
| 2007/0246724 | A1 * | 10/2007 | Wen et al. | 257/98 |
| 2009/0026472 | A1 | 1/2009 | Yasuda et al. | |
| 2010/0133555 | A1 | 6/2010 | Negley | |

FOREIGN PATENT DOCUMENTS

| JP | 2003-243718 A | 8/2003 |
|---|---|---|
| KR | 20-0409165 Y1 | 2/2006 |
| KR | 10-0593937 B1 | 6/2006 |
| KR | 10-2007-0070183 A | 7/2007 |

* cited by examiner

*Primary Examiner* — Luan C Thai
(74) *Attorney, Agent, or Firm* — Birch, Stewart, Kolasch & Birch, LLP

(57) ABSTRACT

A light emitting device package including a package body including a plurality of discrete and separated three-dimensional-shaped indentations formed in an undersurface of the package body and configured to dissipate heat generated in the package body, a cavity in the package body, and a light emitting device including at least one emitting diode in the cavity of the package body and configured to emit light.

21 Claims, 5 Drawing Sheets

LIGHT EMITTING DEVICE PACKAGE

CROSS-REFERENCE TO A RELATED APPLICATION

The present application claims the benefit under 35 U.S.C. §119 of Korean Patent Application No. 10-2009-0013576, filed Feb. 18, 2009, which is hereby incorporated by reference in its entirety.

BACKGROUND OF THE INVENTION

1. Field of the Invention

The present disclosure relates to a light emitting device package.

2. Discussion of the Background

Light emitting devices (LEDs) are semiconductor devices that convert current into light. One example of an LED is a nitride semiconductor such as a gallium nitride (GaN) semiconductor that has a high thermal stability and a wide band gap. The GaN semiconductor can be combined with other elements to fabricate a semiconductor layer emitting green, blue or white light. However, the related-art light emitting device packages including LEDs have a poor heat emission efficiency.

SUMMARY OF THE INVENTION

Accordingly, one object of the present invention is to address the above-noted and other problems.

Another object of the present invention is to provide a light emitting device package that improves the heat emission efficiency.

To achieve these and other advantages and in accordance with the purpose of the present invention, as embodied and broadly described herein, the present invention provides in one aspect a light emitting device package including a package body having a plurality of discrete and separated three-dimensional-shaped indentations formed in an undersurface of the package body and configured to dissipate heat generated in the package body, a cavity in the package body, and a light emitting device including at least one emitting diode in the cavity of the package body and configured to emit light.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Reference will now be made in detail to the embodiments of the present disclosure, examples of which are illustrated in the accompanying drawings.

Figure 1:
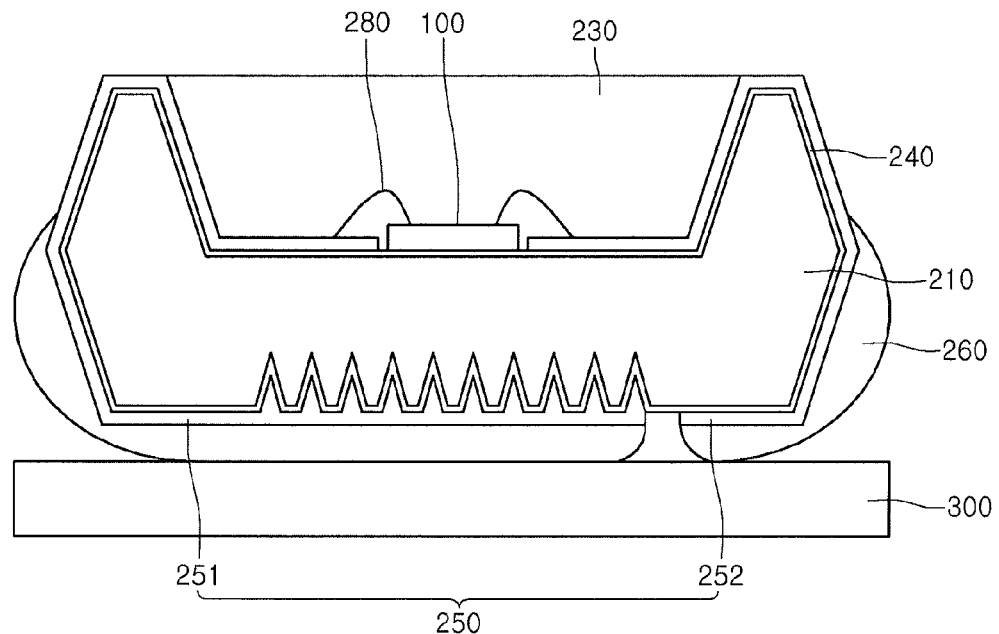
FIG. 1 is an overview illustrating a light emitting device package according to an embodiment of the present invention.

FIG. 1 is an overview illustrating a light emitting device package according to an embodiment of the present invention. As shown, the light emitting device package includes a package body 210, a cavity C and a light emitting device 100. The package body 210 also includes grooves, three-dimensional patterns, etc., which will be discussed in more detail later.

Further, in the embodiment shown in FIG. 1, the cavity C is formed in the package body 210, and the light emitting device 100 is disposed in the cavity C. The rest of the reference numerals in FIG. 1 will now be described with respect to FIGS. 2-6, which illustrate a method of manufacturing a light emitting device package according to an embodiment of the present invention.

Figure 2:
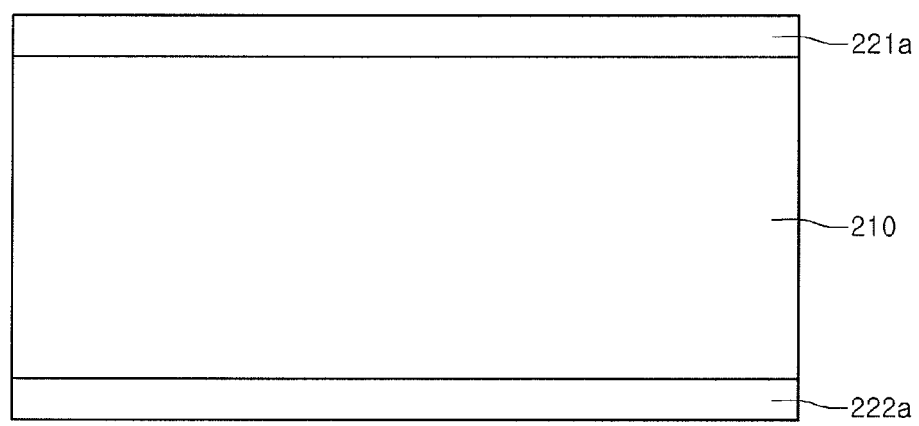
FIGS. 2 to 6 are overviews illustrating a method of manufacturing a light emitting device package according to an embodiment of the present invention.

Referring to FIG. 2, the package body 210 is prepared, and a first mask pattern material 221*a* and a second mask pattern material 222*a* are formed on the top surface and the undersurface of the package body 210, respectively. The package body 210 can also be formed of a silicon material, for example, a silicon-based wafer level package (WLP), and be formed of a polyhedron-shaped frame such as a rectangular parallelepiped. Further, the first and second mask pattern materials 221*a* and 222*a* can be formed of a nitride such as a silicon nitride (SiNx).

Figure 3:
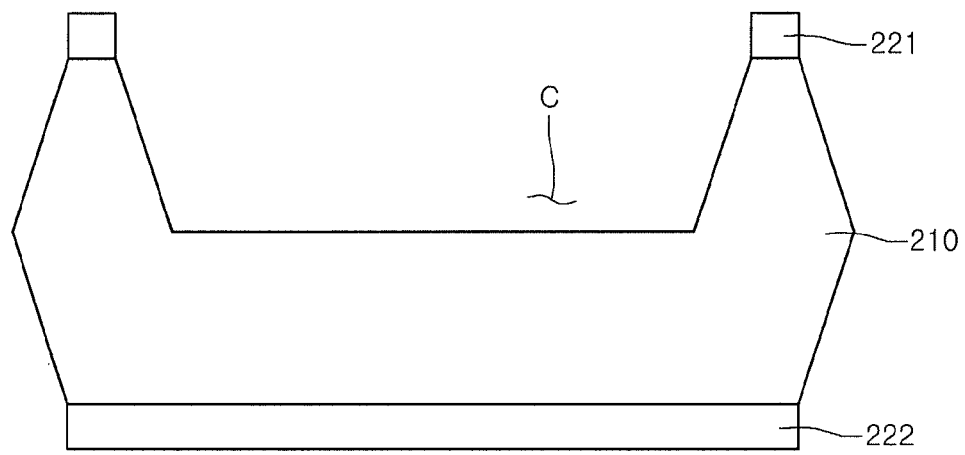

Referring to FIG. 3, the cavity C is formed in the package body 210. Further, a first mask pattern 221 is formed to expose a portion of the top surface of the package body 210 by patterning the first mask pattern material 221*a*. For example, after a first photo-sensitive layer pattern is formed on the first mask pattern material 221*a*, a portion of the first mask pattern of the first photo-sensitive layer pattern 221*a* can be etched to expose a portion of the top surface of the package body 210 using the first photo-sensitive layer pattern as an etching mask.

Next, the package body 210 is etched to form the cavity C using the first mask pattern 221 and the second mask pattern 222 covering the undersurface of the package body 210 as an etch mask. For example, the package body 210 can be wet-etched to form the cavity C using the first mask pattern 221 and the second mask pattern 222 as an etching mask.

In this instance, when the package body 210 is a silicon substrate having a <100> crystal orientation, the etching process can be progressed in a declined direction to allow the cavity to have a wider width of the upper part than that of the lower part as shown in FIG. 3. Further, the cavity C having such a shape has a more efficient optical reflectance.

Figure 4:
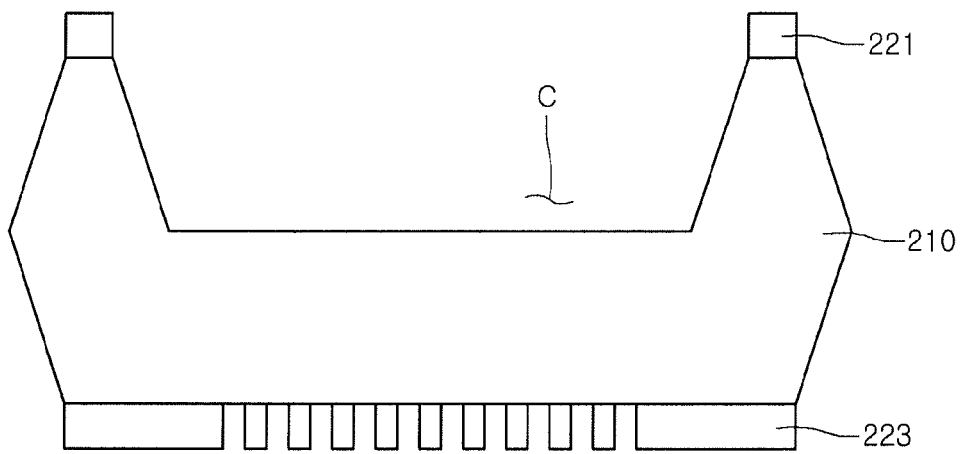

Referring to FIG. 4, a third mask pattern 223 is formed on the undersurface of the package body 210 to expose a certain region thereof. For example, the third mask pattern 223 can be formed by etching the second mask pattern 222 used in the formation of the cavity C to expose a portion of the undersurface of the package body 210. Further, after a second photo-sensitive layer pattern is formed on the second mask pattern 222, the third mask pattern 223 can be formed by performing a dry etching process. Alternatively, the third mask pattern 223 can be separately formed after removing the second mask pattern 222.

Figure 5:
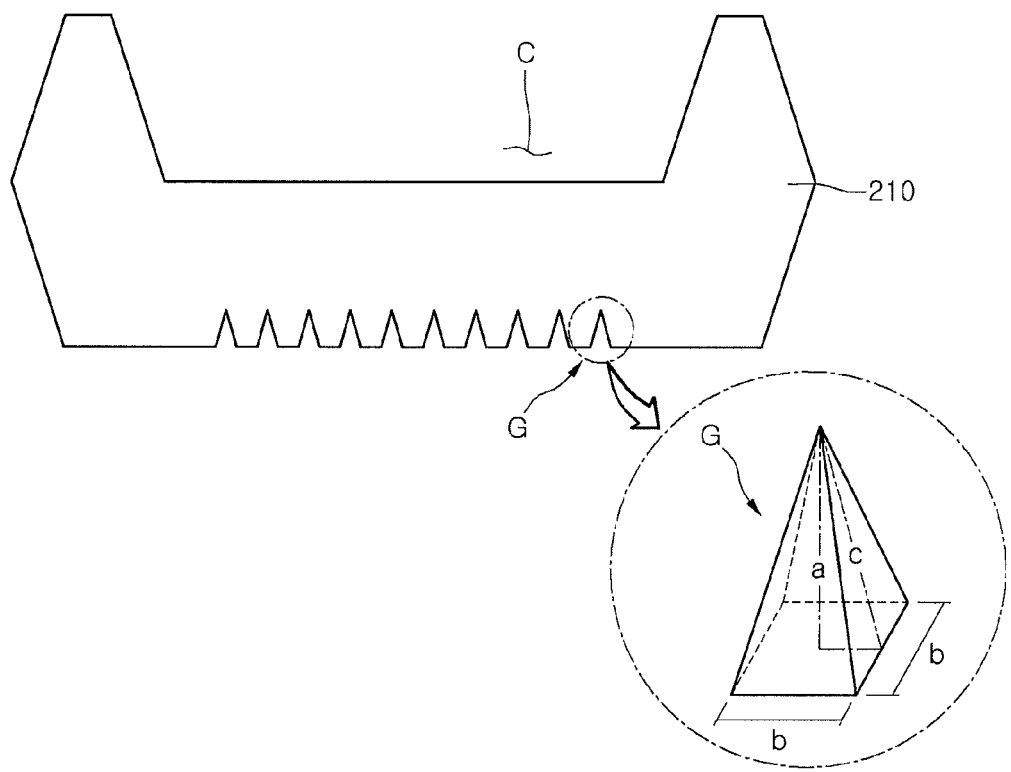

Referring to FIG. 5, a plurality of discrete and separated three-dimensional-shaped indentations G are formed by etching a portion of the undersurface of the package body 210 using the third mask pattern 223 as an etching mask. For example, the discrete and separated three-dimensional-shaped indentations G can be formed by wet-etching a portion of the undersurface of the package body 210 using the third mask pattern 223 as an etching mask. Also, as shown in FIG. 5, the indentations G are discrete and separated from each other by a predetermined distance.

Further, the discrete and separated three-dimensional-shaped indentations G formed in the undersurface of the package body 210 can have at least one of a pyramid shape, a frustrum of a pyramid shape, a prism shape, a circular cylinder shape and a circular truncated cone shape. The discrete and separated three-dimensional-shaped indentations G can also have a pyramid shape such as a quadrangular pyramid, a triangular pyramid, etc. or a prism shape such as triangular prism, a square prism, a circular cylinder, etc.

In addition, the discrete and separated three-dimensional-shaped indentations G improve the heat emission efficiency of the package body 210 by expanding a heat emission area. For example, as illustrated in the magnified view of FIG. 5, when a discrete and separated three-dimensional-shaped indentation G has a quadrangular pyramid shape, "a" represents the depth or height of the indentations G, "b" represents the width of the indentations G, and "c" represents the length of an oblique side of the indentations. Also, when the package body 210 is a silicon substrate having a <100> crystal orientation, the discrete and separated three-dimensional-shaped indentations G can be formed at an inclined angle of about 54.74°.

Further, when a discrete and separated three-dimensional-shaped indentation G is a quadrangular pyramid, the depth of the discrete and separated three-dimensional-shaped indentation G is "a" on the vertical sectional view one side of the square, the bottom of the quadrangular pyramid is "b", and the height of each of four triangles of the quadrangular pyramid is "c." In this instance, the area of the triangle is ½×b×c, and c can be expressed as c=b/(2 cos 54.74°). Therefore, the area S of four triangles on the quadrangular pyramid can be expressed as $S=4\times\frac{1}{2}\times b\times b/(2 \cos 54.71°)=1.73b^2$.

Accordingly, the embodiments of the present invention improve the heat emission efficiency by forming the discrete and separated three-dimensional-shaped indentations G in the undersurface of the package body 210 to expand a heat emission area by about 70% or more of from $b^2$ to $1.73b^2$.

Figure 6:
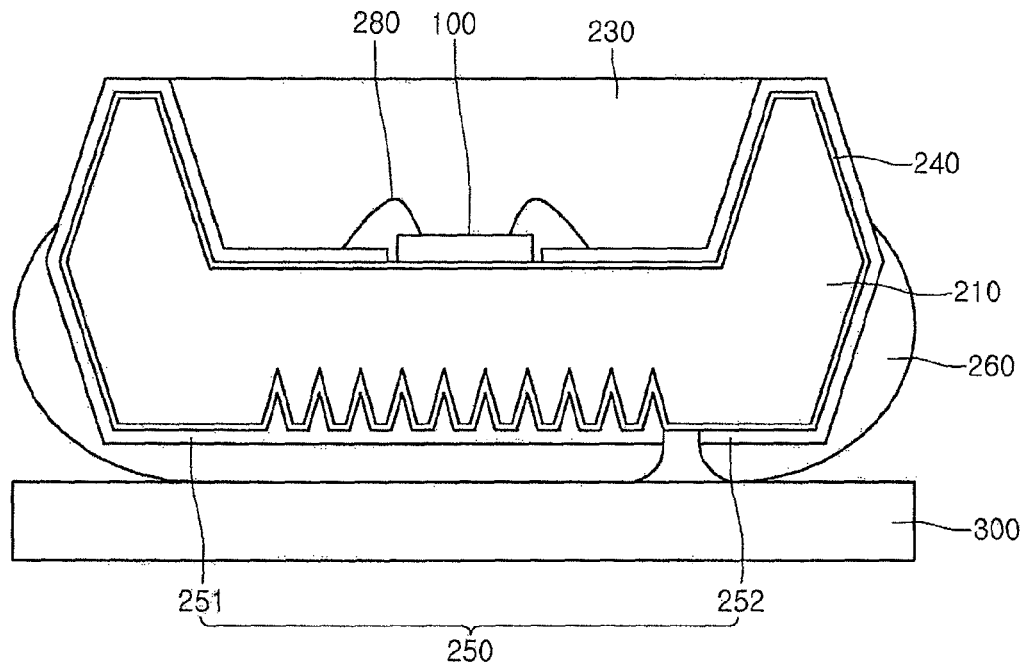

Next, and referring to FIG. 6, after the first mask pattern 221 and the third mask pattern 223 are removed, an insulating layer 240 is formed on the package body 210. Then, a metal layer 250 is formed on the insulating layer 240. Further, the insulating layer 240 can be formed of an insulating material such as a silicon oxide, a silicon nitride, AlN, and SiC. The insulating layer 240 can also be formed through a thermal oxidation process, etc. The insulating layer 240 is also formed to electrically isolate the package body 210 from the metal layer 250 or an external electrode layer sequentially formed on the insulating layer 240.

In addition, the metal layer 250, which is an electrode layer electrically connected to the light emitting device 100, can be formed in a mono- or multi-layer. Also, because a contact between a solder 260 and the insulating layer 240 can be weak, a metal can be formed in the discrete and separated three-dimensional-shaped indentations G in the undersurface of the package body 210.

Also, the metal layer 250 can include a first metal layer 251 serving as an electrode. In addition, a metal layer can be formed on the insulating layer 240 on the discrete and separated three-dimensional-shaped indentations G to be connected to the first metal layer 251, or a third metal layer can be formed separately from the first metal layer 251. Further, the first metal layer 251 or a second metal layer 252 can be extended to the discrete and separated three-dimensional-shaped indentations G of the undersurface of a chip, and the first metal layer 251 can be extended to the undersurface of the chip.

Also, the third metal layer can be formed on the undersurface of the chip separately from the metal layer 250. The metal layer formed in the cavity C among the metal layer 250 can also be formed of a material having a high reflectance, or can be formed of a metal material having a high adhesive strength to resin material. In addition, when the metal layer is a multi-layer, the uppermost layer can be formed of a metal material including at least one of Al, Ag and APC (Ag+Pd+Cu).

Next, the light emitting device 100 is disposed in the cavity C of the package body 210 and can be attached using an adhesive, for example. The adhesive can also be formed of a non-conductive material. The light emitting device 100 can also include at least one colored LED chip or UV chip, but is not limited thereto.

Further, the light emitting device 100 is connected to the metal layer 250 through a wire 280. A resin material 230 is also formed in the cavity C. The resin material 230 can be formed of a transparent epoxy or silicon material, and can include a fluorescent substance. Then, the package body 210 including the light emitting device 100 can be attached to a PCB 300 using a solder 260.

Figure 7:
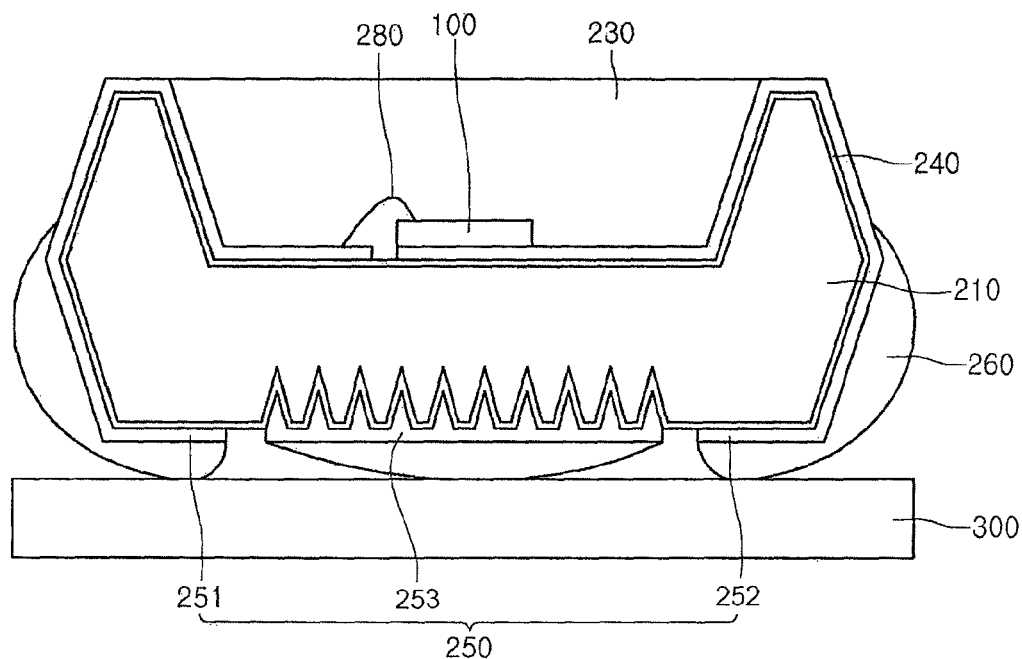
FIG. 7 is an overview illustrating a light emitting device package according to another embodiment of the present invention.
Figure 8:
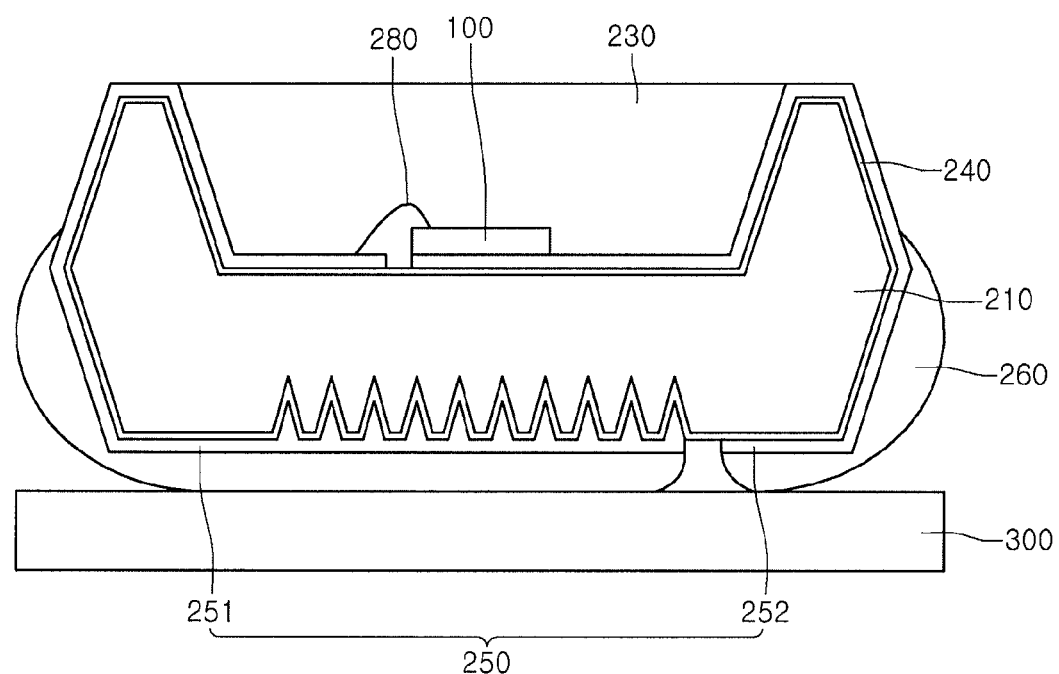
FIG. 8 is an overview illustrating a light emitting device package according to still another embodiment of the present invention.

Next, FIGS. 7 and 8 are overviews illustrating a light emitting device package according to other embodiments of the present invention. As shown in FIG. 7, the metal layer 250 in the undersurface of the package body includes the first metal layer 251, the second metal layer 252 and a third metal layer 253. Alternatively, FIG. 8 illustrates the metal layer 250 in the undersurface of the package body includes the first metal layer 251 and the second metal layer 252.

Further, if the light emitting device 100 is a vertical shape light emitting device, the light emitting device 100 can be formed on the metal layer 250. For example, the light emitting device 100 can be formed on the third metal layer 253 as in FIG. 7 or the light emitting device 100 can be formed on the second metal layer 252 as in FIG. 8. In this instance, one wire 280 can be connected to the light emitting device 100. Also, the solder 260 can be formed on the metal layer 250 and not be formed on the insulating layer 240.

Thus, as described above, the light emitting device package according to the embodiments of the present invention increases the heat emission efficiency by expanding a heat emission area through the discrete and separated three-dimensional-shaped indentations G formed in the package body 210.

Also, when describing the embodiments, when a layer (or film) is referred to as being 'on/over' another layer or substrate, it can be directly on/over another layer or substrate, or intervening layers can also be present. Further, when a layer is referred to as being 'under/below' another layer, it can be directly under/below another layer and one or more intervening layers can also be present. In addition, when a layer is referred to as being 'between' two layers, it can be the only layer between the two layers or one or more intervening layers can also be present.

Also, any reference in this specification to "one embodiment," "an embodiment," "example embodiment," etc., means that a particular feature, structure or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
   a package body including a plurality of discrete and separated three-dimensional-shaped indentations formed in an undersurface of the package body and configured to dissipate heat generated in the package body;
   a cavity in the package body;
   an insulating layer on the package body;
   a light emitting device including at least one light emitting diode in the cavity of the package body and configured to emit light;
   first and second metal layers on inner surfaces of the cavity and extending from a portion near the light emitting device to opposite outside surfaces of the package body, respectively,
   wherein the light emitting device is disposed directly on the insulating layer,
   wherein at least one of the first and second metal layers comprises a plurality of protrusions filling the plurality of discrete and separated three-dimensional-shaped indentations formed in an undersurface of the package body, and
   wherein the plurality of protrusions are physically connected to each other.

2. The light emitting device package of claim 1, wherein said first and second metal layers function as electrodes for turning on and off the light emitting device.

3. The light emitting device package of claim 2, wherein the insulating layer is formed under the first and second metal layers and on the plurality of discrete and separated three-dimensional-shaped indentations.

4. The light emitting device package of claim 3, wherein the first and second metal layers extend around the package body and over the plurality of discrete and separated three-dimensional-shaped indentations with the insulating layer being disposed underneath the first and second metal layers.

5. The light emitting device package of claim 2, wherein the first and second metal layers extending in the cavity comprise a metal material that reflects the light emitted by the light emitting device.

6. The light emitting device package of claim 1, wherein the plurality of discrete and separated three-dimensional-shaped indentations in the undersurface of the package body comprise a pyramid shape.

7. The light emitting device package of claim 1, wherein the package body includes a silicon substrate.

8. The light emitting device package of claim 1, wherein the cavity has a wider width at an upper part than a width of a lower part thereof.

9. The light emitting device package of claim 1, further comprising:
   a resin material in the cavity and covering the light emitting device.

10. The light emitting device package of claim 1, further comprising:
    a printed circuit board including the package body having the light emitting device and being mounted to the printed circuit board via solder.

11. The light emitting device package of claim 1, wherein the cavity has outwardly inclined inner surfaces including a reflective material configured to reflect light emitted by the light emitting device.

12. The light emitting device package of claim 2, wherein the second metal layer stops short of the light emitting diode, and a wire connects the second metal layer to the light emitting device for turning on and off the light emitting diode.

13. The light emitting device package of claim 2, wherein the first and second metal layers stop short of the light emitting device, and two wires respectively connect the first and second metal layers to the light emitting diode for turning on and off the light emitting diode.

14. The light emitting device package of claim 1, wherein the plurality of discrete and separated three-dimensional-shaped indentations have a quadrangular pyramid shape, and an area of a corresponding three-dimensional-shaped indentation is defined by the following equation:
    $A=1.73b^2$, where "b" is a bottom area of the quadrangular pyramid.

15. The light emitting device package of claim 1, wherein an inclination angle of a corresponding discrete and separated three-dimensional-shaped indentation is about 54.74°.

16. A light emitting device package, comprising:
    a package body including a plurality of discrete and separated three-dimensional-shaped indentations formed in an undersurface of the package body and configured to dissipate heat generated in the package body;
    a cavity in the package body;
    an insulating layer on the package body,
    wherein the insulating layer is disposed on the plurality of discrete and separated three-dimensional-shaped indentations;
    a light emitting device including at least one light emitting diode in the cavity of the package body and configured to emit light;
    first and second metal layers on inner surfaces of the cavity and extending from a portion near the light emitting device to opposite outside surfaces of the package body, respectively; and
    a third metal layer on the insulating layer disposed on the discrete and separated three-dimensional-shaped indentations and being separated from the first and second metal layers by a predetermined gap,
    wherein the third metal layer comprises a plurality of protrusions filling the plurality of discrete and separated three-dimensional-shaped indentations formed in an undersurface of the package body, and wherein the plurality of protrusions are physically connected each other.

17. The light emitting device package of claim 16, wherein third the metal layer is continuously connected.

18. The light emitting device package of claim 16, wherein the third metal layer includes an upper surface having a shape defined by the three-dimensional-shaped indentations formed in the undersurface of the package body.

19. A light emitting device package, comprising:
a package body including a plurality of discrete and separated three-dimensional-shaped indentations formed in an undersurface of the package body and configured to dissipate heat generated in the package body;
a cavity in the package body;
an insulating layer on the package body;
a light emitting device including at least one light emitting diode in the cavity of the package body and configured to emit; and
first and second metal layers on inner surfaces of the cavity and extending from a portion near the light emitting device to opposite outside surfaces of the package body, respectively,
wherein the light emitting device is disposed on the insulating layer,
wherein the package body comprises a silicon material,
wherein at least one of the first and second metal layers comprises a plurality of protrusions filling the plurality of discrete and separated three-dimensional-shaped indentations formed in an undersurface of the package body, and
wherein the plurality of protrusions are physically connected to each other.

20. The light emitting device package of claim 1, wherein a material of the at least one of the first and second metal layers is same as a material of the plurality of protrusions filling the plurality of discrete and separated three-dimensional-shaped indentations formed in the undersurface of the package body.

21. The light emitting device package of claim 1, wherein the plurality of protrusions are physically connected with the at least one of the first and second metal layers.

* * * * *